United States Patent
Wang et al.

(10) Patent No.: US 9,202,557 B2
(45) Date of Patent: Dec. 1, 2015

(54) THREE-DIMENSIONAL TWO-PORT BIT CELL

(71) Applicant: Taiwan Semiconductor Manufacturing Co., Ltd., Hsin-Chu (TW)

(72) Inventors: Li-Wen Wang, Taichung (TW); Yen-Huei Chen, Jhudong Township (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 141 days.

(21) Appl. No.: 14/033,537

(22) Filed: Sep. 23, 2013

(65) Prior Publication Data

US 2015/0085567 A1  Mar. 26, 2015

(51) Int. Cl.
| | | |
|---|---|---|
| G11C 11/00 | (2006.01) | |
| G11C 11/419 | (2006.01) | |
| H01L 27/11 | (2006.01) | |
| G11C 8/16 | (2006.01) | |
| H01L 27/06 | (2006.01) | |
| G11C 5/02 | (2006.01) | |
| G11C 8/08 | (2006.01) | |
| G11C 11/412 | (2006.01) | |

(52) U.S. Cl.
CPC ............. *G11C 11/419* (2013.01); *G11C 5/025* (2013.01); *G11C 8/08* (2013.01); *G11C 8/16* (2013.01); *G11C 11/412* (2013.01); *H01L 27/0688* (2013.01); *H01L 27/1104* (2013.01)

(58) Field of Classification Search
CPC ............. G11C 11/412; G11C 11/4125; H01L 27/1104
USPC .................. 365/156, 130, 82, 189.01, 189.04
See application file for complete search history.

(56) References Cited

U.S. PATENT DOCUMENTS

| | | | |
|---|---|---|---|
| 7,797,594 B1* | 9/2010 | Parulkar et al. ................ 714/719 |
| 7,969,193 B1* | 6/2011 | Wu et al. .......................... 326/82 |
| 2008/0291767 A1* | 11/2008 | Barnes et al. ............. 365/230.05 |
| 2009/0141545 A1* | 6/2009 | Norman ......................... 365/163 |
| 2011/0141792 A1* | 6/2011 | Ozatay et al. .................. 365/130 |

* cited by examiner

*Primary Examiner* — Connie Yoha
(74) *Attorney, Agent, or Firm* — Duane Morris LLP

(57) ABSTRACT

A semiconductor memory includes a read port array disposed on a first layer of a three-dimensional integrated circuit and a bit cell array disposed on a second layer of the three-dimensional integrated circuit. The second layer being vertically positioned above or below the first layer. At least one bit cell of the bit cell array is coupled to at least one read port cell of the read port array by a via extending from the first layer to the second layer.

20 Claims, 9 Drawing Sheets

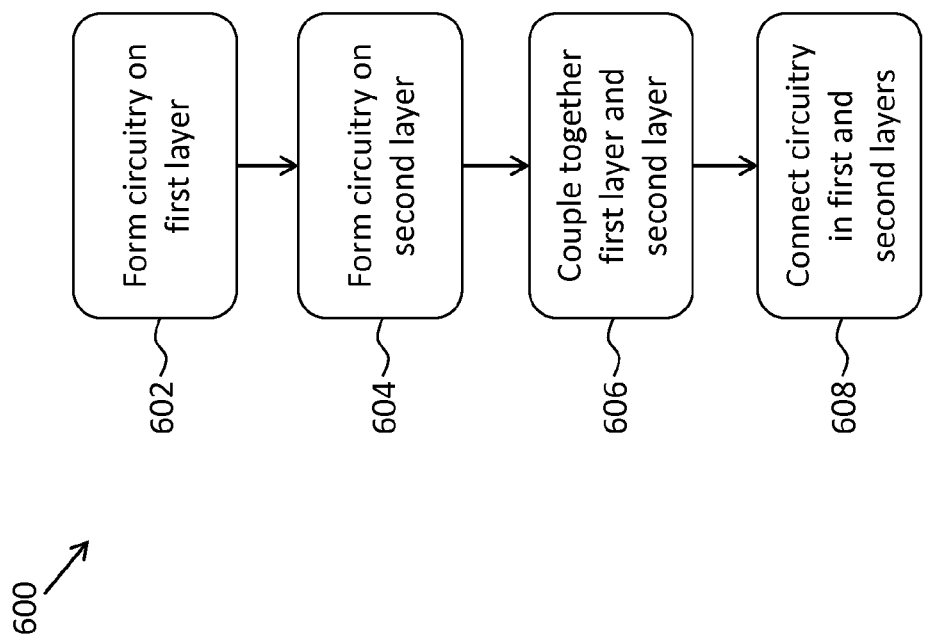

THREE-DIMENSIONAL TWO-PORT BIT CELL

FIELD OF DISCLOSURE

The disclosed circuits and methods relate to semiconductor memories. More particularly, the disclosed circuits and methods relate to three-dimensional two-port bit cells for semiconductor memories.

BACKGROUND

Static random access memories ("SRAM") include a plurality of cells disposed in rows and columns to form an array. SRAM cells include a plurality of transistors coupled to bit lines and word lines that are used to read and write a bit of data to the memory cell. Single-port SRAMs enable a single bit of data to be written to or read from a bit cell at a particular time. In contrast, a dual-port SRAMs enables multiple reads or writes to occur at approximately the same time. Conventional dual-port SRAM structures include word lines ("WLs") in different metal layers, which causes different capacitive loading due to the different metal layers being used to route signals of the SRAM. Dual-port SRAM structures are larger and wider in the WL direction than a single-port SRAM structure. Due to the larger and wider WL direction for the dual-port SRAM, the aspect ratio of an SRAM macro can be impacted during heavy WL loading, especially for wide input/output ("I/O") designs. When compared with a single-port SRAM, the periphery logic circuitry of the dual-port SRAM is doubled. As such, dual-port SRAMs can occupy a larger area, and signal routing complexities can occur.

BRIEF DESCRIPTION OF THE DRAWINGS

FIG. 6 is a flow diagram of one example of a method of fabricating a three-dimensional semiconductor memory in accordance with some embodiments.

DETAILED DESCRIPTION

This description of the exemplary embodiments is intended to be read in connection with the accompanying drawings, which are to be considered part of the entire written description.

The disclosed circuits advantageously eliminate single-ended read access issues that can affect convention two-dimensional semiconductor memories. Additionally, the disclosed circuits improves the performance of a semiconductor memory (e.g., speed and area) while preventing read disturb issues.

Figure 1:
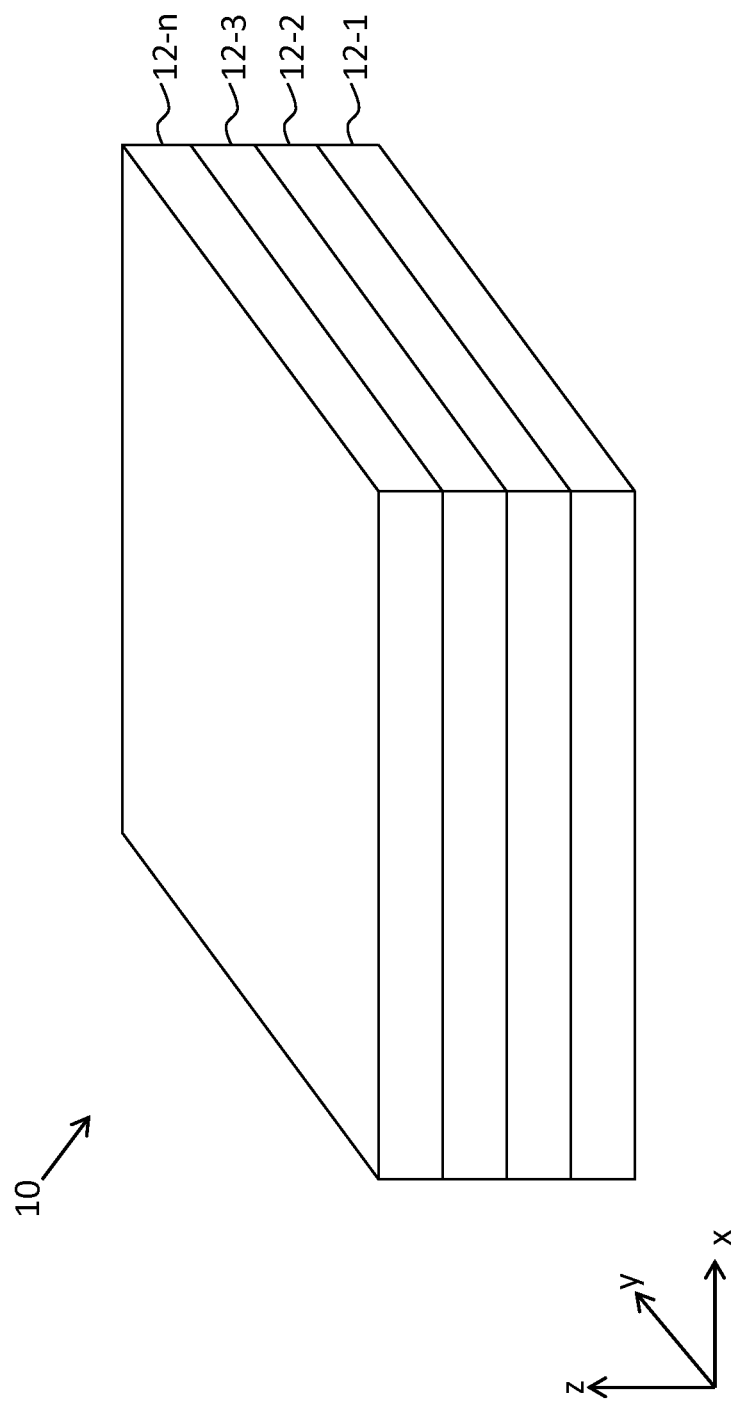
FIG. 1 is a perspective view of one example of a three-dimensional semiconductor integrated circuits in accordance with some embodiments.

FIG. 1 illustrates one example of a three-dimensional ("3D") semiconductor integrated circuit ("IC") 10. 3D IC 10 includes a plurality of layers 12-1, 12-2, 12-3, 12-$n$ ("layers 12") that are vertically stacked on top of one another in the z-direction. In some embodiments, layers 12 are individual dies that are electrically coupled to one another with at least one through-substrate via ("TSV") or inter-layer via ("ILV") (not shown). In some embodiments, 3D IC 10 is a 3D IC such that each layer 12 is a respective "tier" where each tier includes a respective active device layer and a respective interconnect structure, which can include a plurality of conductive layers (e.g., M1, M2, etc.). Interlayer dielectric ("ILD") layers (not shown) can be disposed between directly adjacent tiers as will be understood by one of ordinary skill in the art.

Figure 2A:
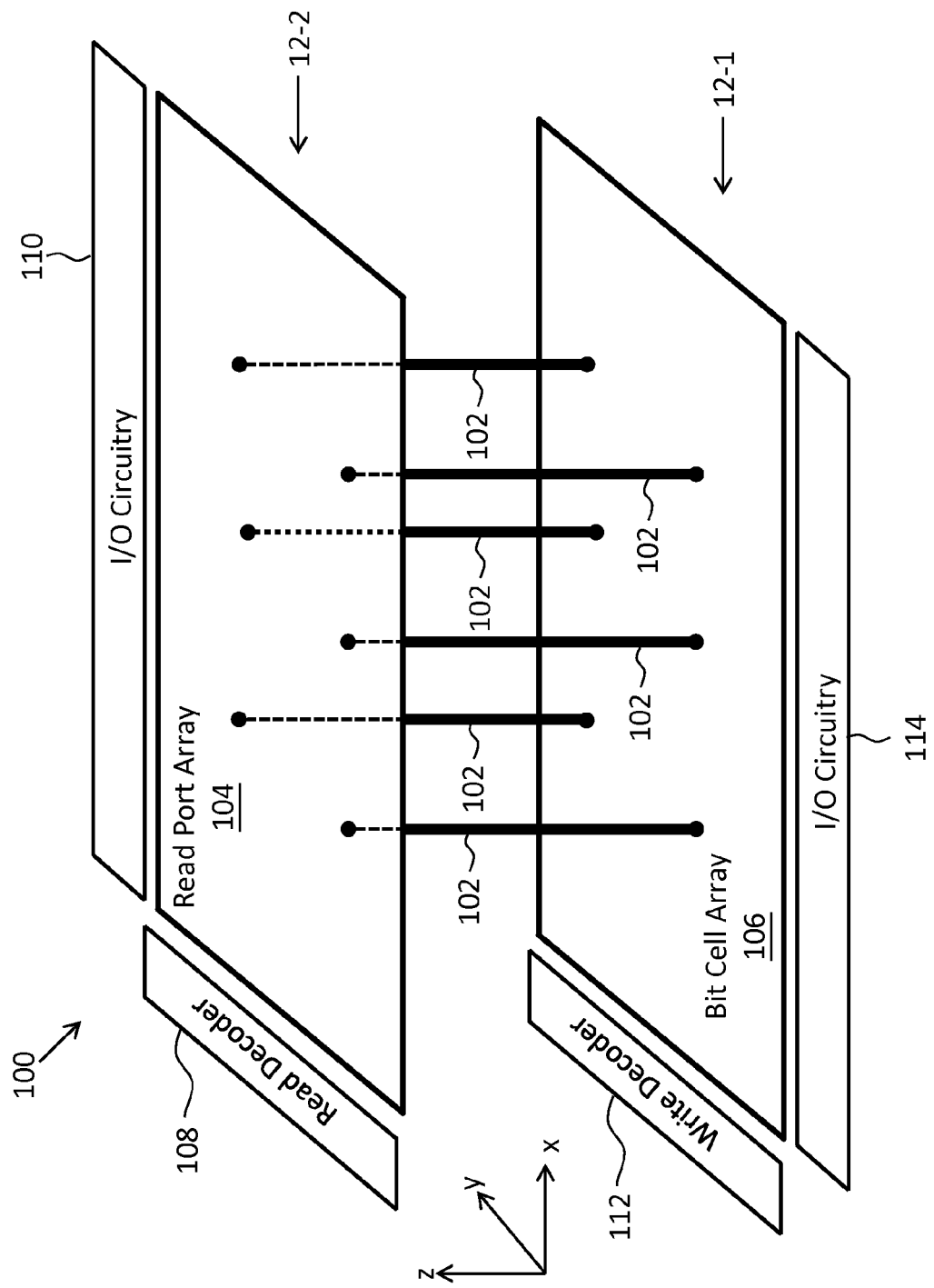
FIG. 2A is a simplified block diagram of one example of a three-dimensional semiconductor memory in accordance with some embodiments.

FIG. 2A illustrates one example of a 3D semiconductor memory 100 in accordance with some embodiments. As shown in FIG. 100, semiconductor memory 100 is disposed across two layers 12-1 and 12-2 that are arranged vertically with respect to one another and coupled together by a plurality of conductive lines 102, such as, for example, metal lines, vias, TSVs, and ILVs, to list only a few possibilities. Conductive lines 102 couple together a read port array 104, which is disposed on one layer, e.g., layer 12-2, and a cell array 106, which is disposed on another layer, e.g., layer 12-1. Although read port array 104 is illustrated as being disposed on a layer above the layer on which cell array 106 is disposed, it is possible for the layer on which read port array 104 is disposed to be vertically the layer on which cell array 106 is disposed. Further, layers 12-1, 12-2 in FIG. 1 can have a different arrangement than the arrangement illustrated in FIG. 1 such that layer 12-1 can be a layer other than a bottom layer and not be directly disposed adjacent to layer 12-2.

A read decoder 108 is also disposed on the same layer as read port array 104. Read decoder 108 is configured to receive a read address and decode the address to a location in the read port array 104 to which read decoder 108 is coupled by read word lines ("RWLs") (not shown in FIG. 2A) that extend across layer 12-2 in the x-direction. Input/output ("I/O") circuitry 110 is also provided on the same layer as read port array 104. In some embodiments, I/O circuitry 110 is read I/O circuitry configured to output signals read from bit cells during a read operation that are transmitted from the read port array 104 to I/O circuitry 110 by global read bit lines ("GRBLs") (not shown in FIG. 2A) that extend across layer 12-2 in the y-direction.

Cell array 106 is disposed on the same layer as a write decoder 112 and I/O circuitry 114. Write decoder 112 is configured to receive an address at which data is to be written, decode the address to a bit cell location, and to assist in the writing of data by activating a write word line ("WWL") (not shown in FIG. 2A) that couples decoder 112 to cell array 106. WWLs extend across layer 12-1 in the x-direction. In some embodiments, I/O circuitry 114 is write I/O circuitry coupled to bit cells of cell array 106 by complementary bit lines (e.g., BL and BLB) (not shown in FIG. 2A) that extend across layer 12-1 in the y-direction.

Figure 2B:
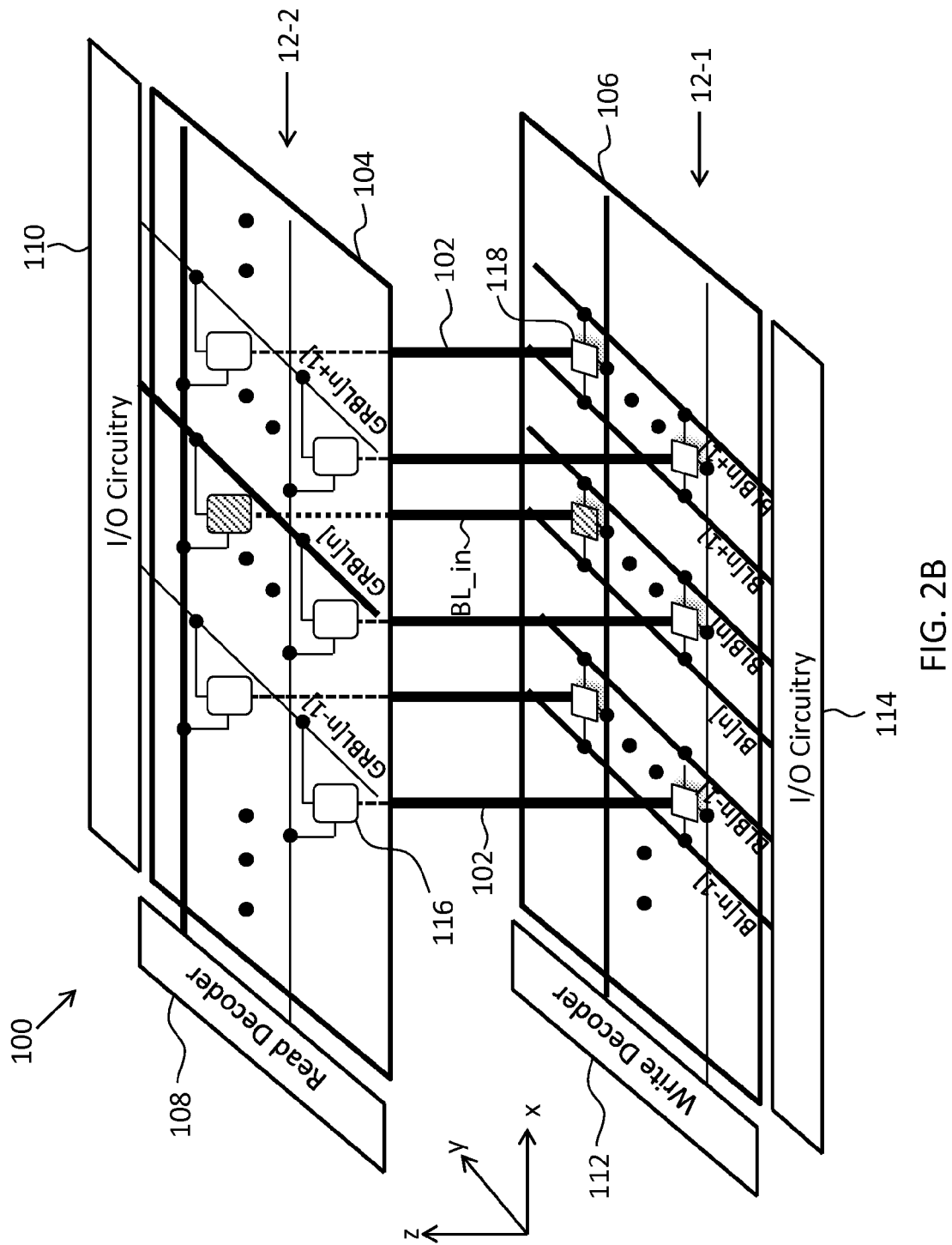
FIG. 2B is a more detailed block diagram of the three-dimensional semiconductor memory in accordance with some embodiments.

FIG. 2B is a more detailed diagram of a 3D semiconductor memory 100 illustrated in FIG. 2A in accordance with some embodiments. As shown in FIG. 2B, read port array 104 includes a plurality of read port cells 116 arranged in rows, which extend across layer 12-2 in the x-direction, and columns, which extend across layer 12-2 in the y-direction. Each read port cell 116 is coupled to a GRBL, a pair of complementary read word lines (RBL and RBL'), and to a conductive line 102, which functions as a input bit line, BL_in, and coupled together the read port cell 116 to a bit cell 118 as described in more detail below. As described above, the RWLs extend across layer 12-2 in the x-direction and couple a row of read port cells to read decoder 108, and the GRBLs extend across layer 12-2 in the y-direction and couple a column of read port cells 116 to I/O circuitry 110.

Cell array 106 includes a plurality of bit cells 118 arranged in rows, which extend across layer 12-1 in the x-direction, and columns, which extend across layer 12-1 in the y-direction. Each bit cell 118 is coupled to a WWL, a pair of complementary bit lines, BL and BLB, and to a conductive line 102, which functions as an extension of a bit line, e.g., BL_in, as described below. The WWLs extend across layer 12-1 in the x-direction and couples a row of bit cells to write decoder 112, and complementary bit lines BL and BLB extend across layer 12-1 in the y-direction to couple a column of bit cells to I/O circuitry 114.

Figures 3A, 3B:
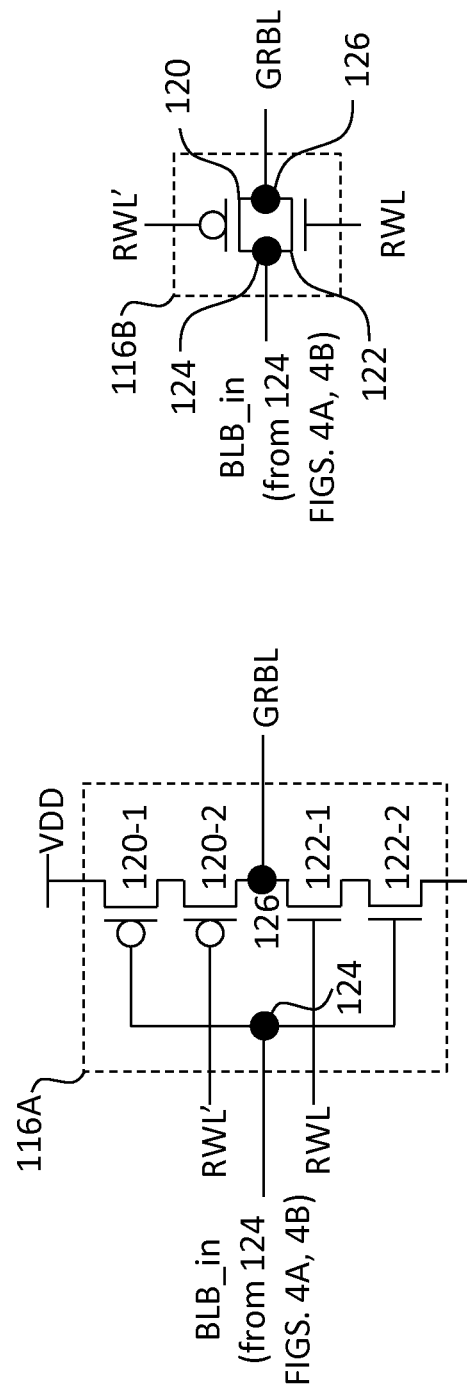
FIG. 3A is a circuit diagram of one example of a tri-state buffer implementation of a read port cell in accordance with some embodiments.
FIG. 3B is a circuit diagram of one example of a transmission gate implementation of a read port cell in accordance with some embodiments.

Read port cells 116 can be implemented in a variety of configurations including, but not limited to, a tri-state buffer or a transmission gate to list only a couple of possible implementations. FIG. 3A illustrates one example of a tri-state buffer implementation of a read port cell, and FIG. 3B illustrates one example of a transmission gate implementation of a read port cell.

Referring first to FIG. 3A, read port cell 116A includes a pair of transistors of a first type 120-1, 120-2 and a pair of transistors of a second type 122-1, 122-2. In some embodiments, the transistors of the first type are implemented as PMOS transistors and the transistors of the second type are implemented as NMOS transistors; however, these transistors can be implemented as other transistor types. Transistor 120-1, which can be referred to as a pull-up transistor, has its sourced coupled to a power supply node set at VDD, its drain coupled to the gate of transistor 120-2, and its gate coupled node 124. Transistor 120-2, which also can be referred to as a pull-up transistor, has its drain coupled to node 126 and its gate coupled to receive RWL' from decoder 108 (FIGS. 2A and 2B).

Transistor 122-1, which is sometimes referred to as a pull-down transistor, has its drain coupled to node 126, its source coupled to the drain of transistor 122-2, and its gate configured to receive RWL from decoder 108 (FIGS. 2A and 2B). Node 126 serves as the output of read port cell 116 and is coupled to a GRBL. Transistor 122-2, which can also be referred to as a pull-down transistor, has its source coupled to ground and its gate coupled to node 124, which is coupled to the gate of transistor 120-1 as described above. Node 124 is configured to receive BL_in from an associated bit cell 116 disposed in layer 12-1. As described above, signal BL-in is transmitted from layer 12-1 to layer 12-2 by a conductive line 102.

Turning now to FIG. 3B, read port cell 116B is configured as a transmission gate including a first transistor 120 and a second transistor 122. In some embodiments, transistor 120 is a PMOS transistor and transistor 122 is an NMOS transistor. The source of transistor 120 is coupled to node 124, the gate of transistor 120 is configured to receive RWL', and the drain of transistor 120 is coupled to node 126. The source of transistor 122 is coupled to node 122, the gate of transistor 122 is configured to receive RWL, and the drain of transistor 122 is coupled to node 126. Node 124 is configured to receive signal BLB_in, and node 126 is coupled to GRBL.

Figure 4A:
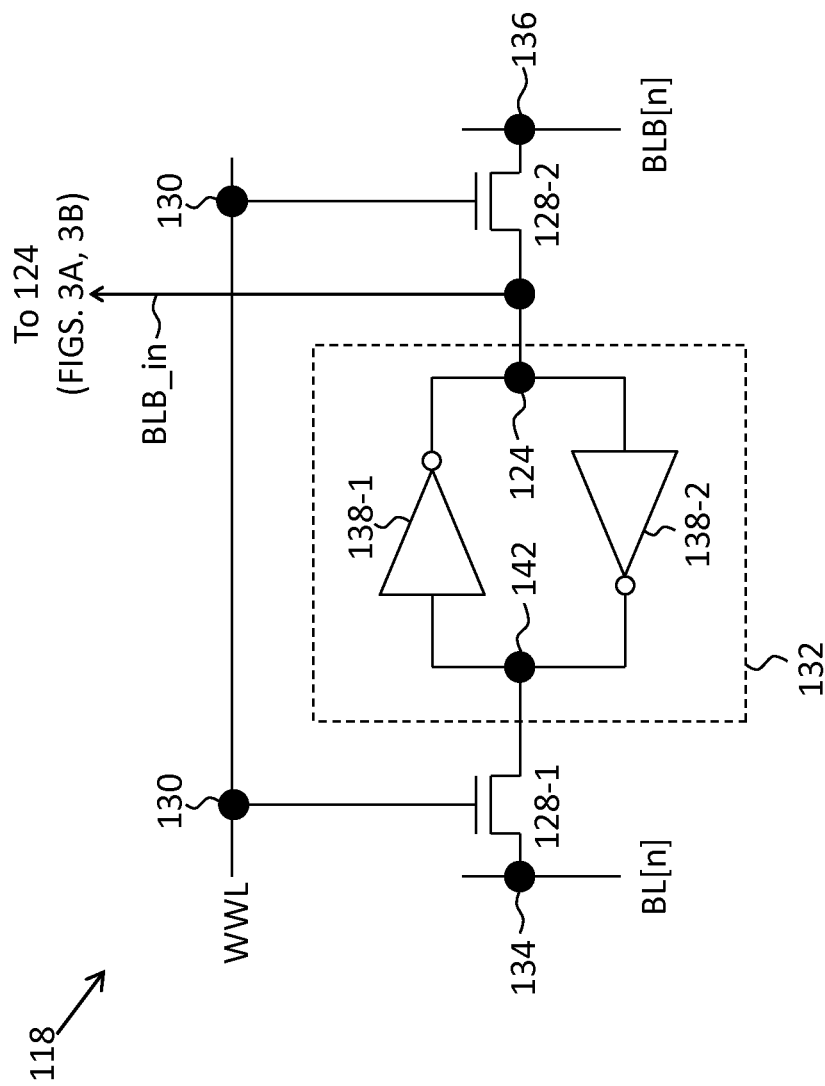
FIG. 4A is a circuit diagram of one example of a bit cell in accordance with some embodiments.

FIG. 4A illustrates one example of a bit cell 118 in accordance with some embodiments. Bit cell 118 includes a pair of pass transistors 128-1, 128-2 each having its respective gate coupled to the same WWL at node 130 and its respective drain coupled to latch 132. The source of transistor 128-1 is coupled to a bit line, BL[n] at node 134, and the source of transistor 128-2 is coupled to complementary bit line BLB[n] at node 136. Latch 132 includes a pair of cross-coupled inverters 138-1 and 138-2, which are arranged such that that output of inverter 138-1 is coupled to the input of inverter 138-2 at node 124, and the output of inverter 138-2 is coupled to the input of inverter 138-1 at node 142. Node 142 is also coupled to the drain of transistor 128-1, and node 140 is coupled to the drain of transistor 128-2 and to the via that carries signal BL_in to the layer in which a read port cell 116 is disposed, e.g., layer 12-1.

Figure 4B:
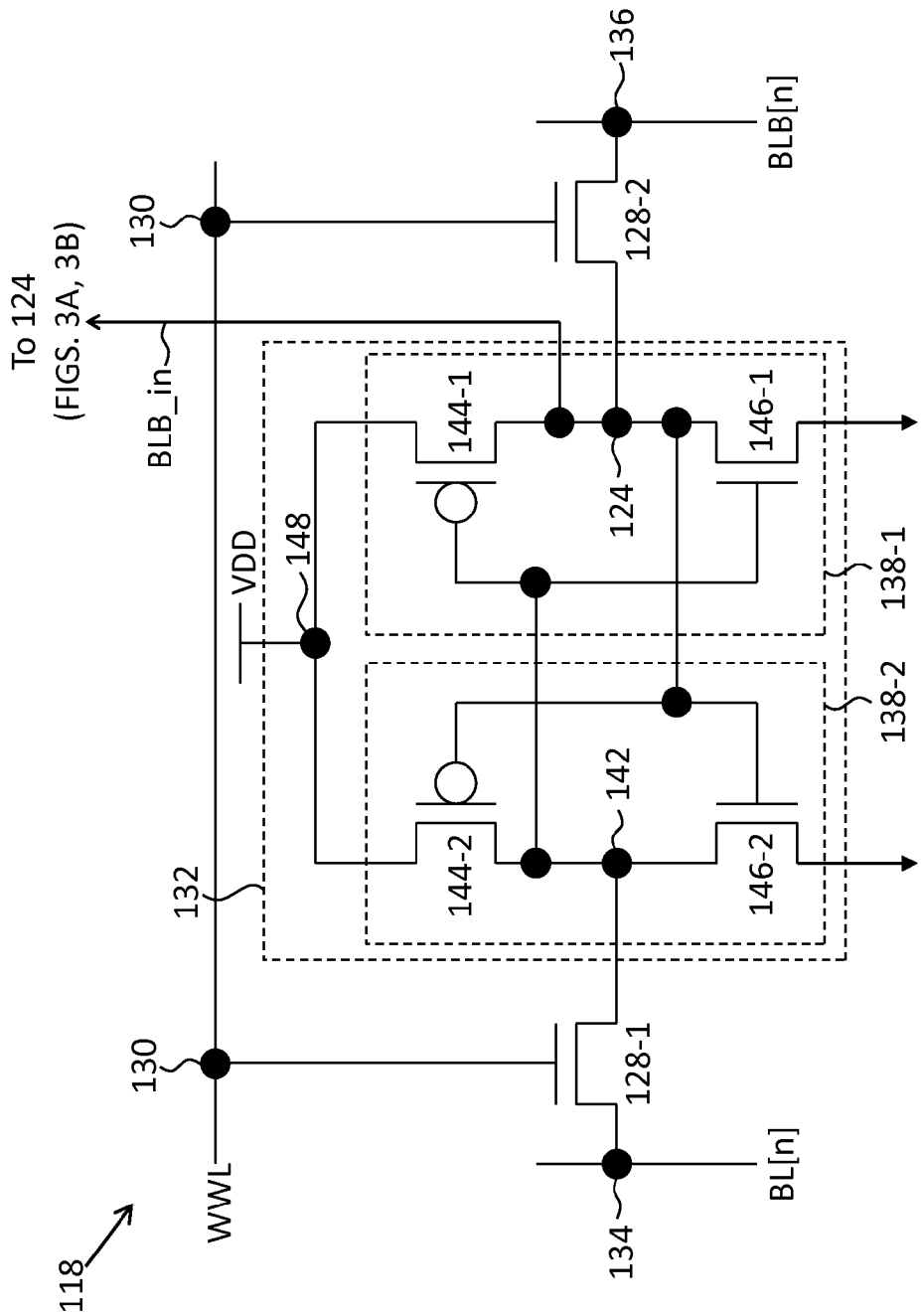
FIG. 4B is a more detailed circuit diagram of one example of a bit cell in accordance with some embodiments.

FIG. 4B is a more detail diagram of a bit cell 118 in accordance with some embodiments. As shown in FIG. 4B, in some embodiments, inverters 138-1, 138-2 each include a pair of transistors. For example, inverter 138-1 includes transistors 144-1 and 146-1, and inverter 138-2 includes transistors 144-2 and 146-2. In some embodiments, transistors 144-1, 144-2 are PMOS transistors and transistors 146-1, 146-2 are NMOS transistors. However, transistors 144-1, 144-2, 146-1, 146-2 can be implemented as other transistor types.

Transistor 144-1 has its source coupled to node 148, which in some embodiments is coupled to a power supply node set at VDD. The drain of transistor 144-1 is coupled to node 124, which serves as the output of transistor 134-1, and the gate of transistor 144-1 is coupled to node 142, which serves as the input of inverter 138-1. Transistor 146-1 has its drain coupled to node 124, its source coupled ground or VSS, and is gate coupled to node 142. As described above, node 124 is also coupled to a read port cell 116 by a conductive line 102 along which signal BL_in is transmitted.

Transistor 144-2 of inverter 138-2 has its source coupled to node 148, its drain coupled to node 142, and its gate coupled to node 124. Node 142 is coupled to the drain of transistor 128-1 and is configured as the output of inverter 138-2 and the input of inverter 138-1. Transistor 146-2 of inverter 138-2 has its source coupled to ground or VSS, its drain coupled to node 142, and its gate coupled to node 124. Although the bit cell 118 illustrated in FIGS. 4A and 4B is shown as a six transistor ("6T") bit cell, one of ordinary skill in the art will understand that bit cell 118 can have other implementations with fewer or more transistors.

The reading of a logic zero from storage node 142 of bit cell 118 is described with reference to FIG. 5A, which is a flow diagram of one example of a method of reading a logic zero from a semiconductor memory 100. At block 502, bit lines BL and BLB are pre-charged to a pre-charge voltage and the WWL is at a low voltage level, i.e., VSS or ground. In some embodiments, the pre-charge voltage is generated by a pre-charge circuit (not shown) and is a high voltage level, e.g., VDD, or another voltage level, e.g., VDD/2. In some embodiments, the BL and BLB are not pre-charged or are pre-charged to other voltage levels. With the WWL set at approximately VSS, pass transistors 128-1 and 128-2 are in a non-current conducting or 'off' state since their gate-source voltage, $V_{GS}$, is less than the turn-on voltage, $V_T$. RWL is also at a logic zero such that RWL' is a logic one as RWL' has the opposite logic state of RWL.

At block 504, the voltage on RWL is increased to VDD to turn on transistor 122-1 of read port cell 116A. Transistor 120-2 also is turned on in response to signal RWL' being transitioned from a logic one to a logic zero. Bit lines BL and BLB continue to be decoupled from bit cell 118 as the WWL continues to be set at a logic zero such that pass transistors 128-1, 128-2 decouple the bit lines BL, BLB from the bit cell 118.

At block 506, the logic zero is read out to a GRBL. For example, the voltage of storage node 142 is inverted, and the inverted signal at node 124, i.e., a logic one, is transmitted to read port cell 116 as signal BL_in along a conductive line 102, which in some embodiments is an inter-layer via ("ILV"). The logic one at node 124 of read port cell 116A (FIG. 3A) is inverted by virtue of transistor 120-1 being turned off by the presence of a logic one at its gate and transistor 122-2 being turned on by the presence of a logic one at its gate. With transistors 122-1, 122-2 on, node 126 of read bit cell 116A is coupled to ground such that current drains away from node 126. Node 126 is decoupled from VDD despite transistor 118-2 being turned on as transistor 120-1 is turned off. The voltage of GRBL, which is coupled to node 126, is pulled down as node 126 is coupled to ground through transistors 122-1, 122-2.

At block 508, the reading operation when the RWL transitions from a logic one to a logic zero to turn off transistors 120-2 and 122-1. The BL and BLB are re-coupled to the pre-charge voltage source that places a pre-charge voltage on BL and BLB.

Figures 5A, 5B:
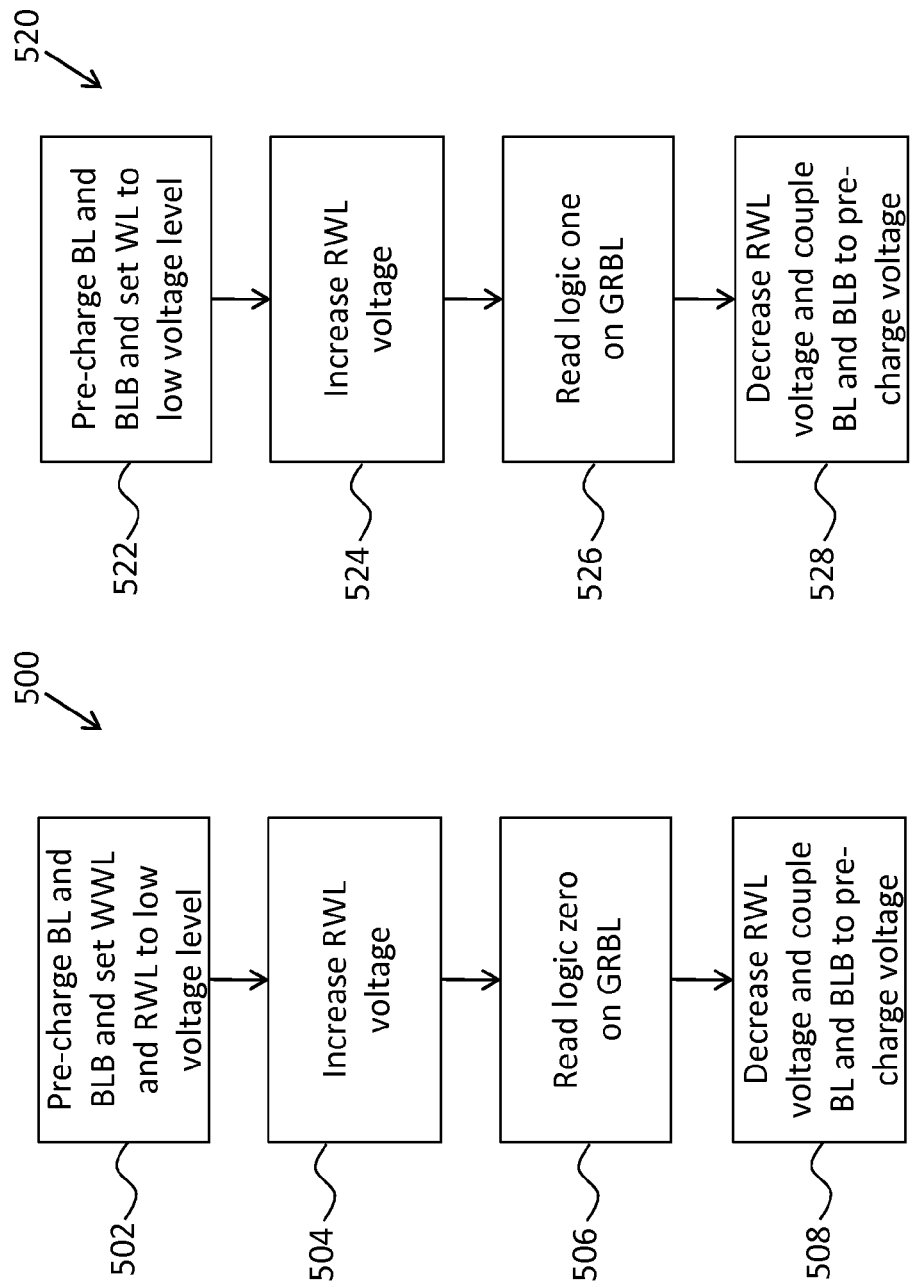
FIG. 5A is a flow diagram of one example of a method of reading a logic zero from a bit cell in accordance with some embodiments.
FIG. 5B is a flow diagram of one example of a method of reading a logic one from a bit cell in accordance with some embodiments.

FIG. 5B is a flow diagram of one example of a method 520 of reading a logic one from storage node 142 of bit cell 118 (FIGS. 4A and 4B). At block 522, bit lines BL and BLB are pre-charged to a pre-charge voltage and WWL is at a low voltage level, i.e., VSS or ground. In some embodiments, the pre-charge voltage is generated by a pre-charge circuit (not shown) and is a high voltage level, e.g., VDD, or another voltage level, e.g., VDD/2. In some embodiments, the BL and BLB are not pre-charged or are pre-charged to other voltage levels. With the WWL set at approximately VSS, pass transistors 128-1 and 128-2 are in a non-current conducting or 'off' state since their gate-source voltage, $V_{GS}$, is less than the turn-on voltage, $V_T$. RWL is also at a logic zero such that RWL' is a logic one as RWL' has the opposite logic state of RWL.

At block 524, the voltage on RWL is increased to VDD to turn on transistors 120-2 and 122-1. Bit lines BL and BLB continue to be decoupled from bit cell 118 as WWL continues to be set at a logic zero such that pass transistors 128-1, 128-2 decouple the bit lines BL, BLB from the bit cell 118.

At block 526, a logic one is read out to a GRBL. For example, the voltage at node 124, which is the inverse of the voltage stored at node 142, i.e., a logic zero, is received at node 124 of read port cell 116A (FIG. 3A). The voltage at node 124 is inverted by virtue of transistor 120-1 being turned on by the presence of a logic one at its gate and transistor 122-2 being turned off by the presence of a logic zero at its gate. With transistors 120-1, 120-2 on, node 126 of read bit cell 116A is coupled to VDD such that current flows from VDD to node 126. Node 126 is decoupled from ground (or VSS) despite transistor 122-1 being turned on as transistor 122-2 is turned off. The voltage of GRBL, which is coupled to node 126, is pulled increased as node 126 is coupled to VDD through transistors 120-1, 120-2.

At block 528, the reading operation ends 528 when the RWL transitions from a logic one to a logic zero to turn off transistors 120-2 and 122-1. The BL and BLB are re-coupled to the pre-charge voltage source to pre-charge BL and BLB.

Figures 5C, 5D:
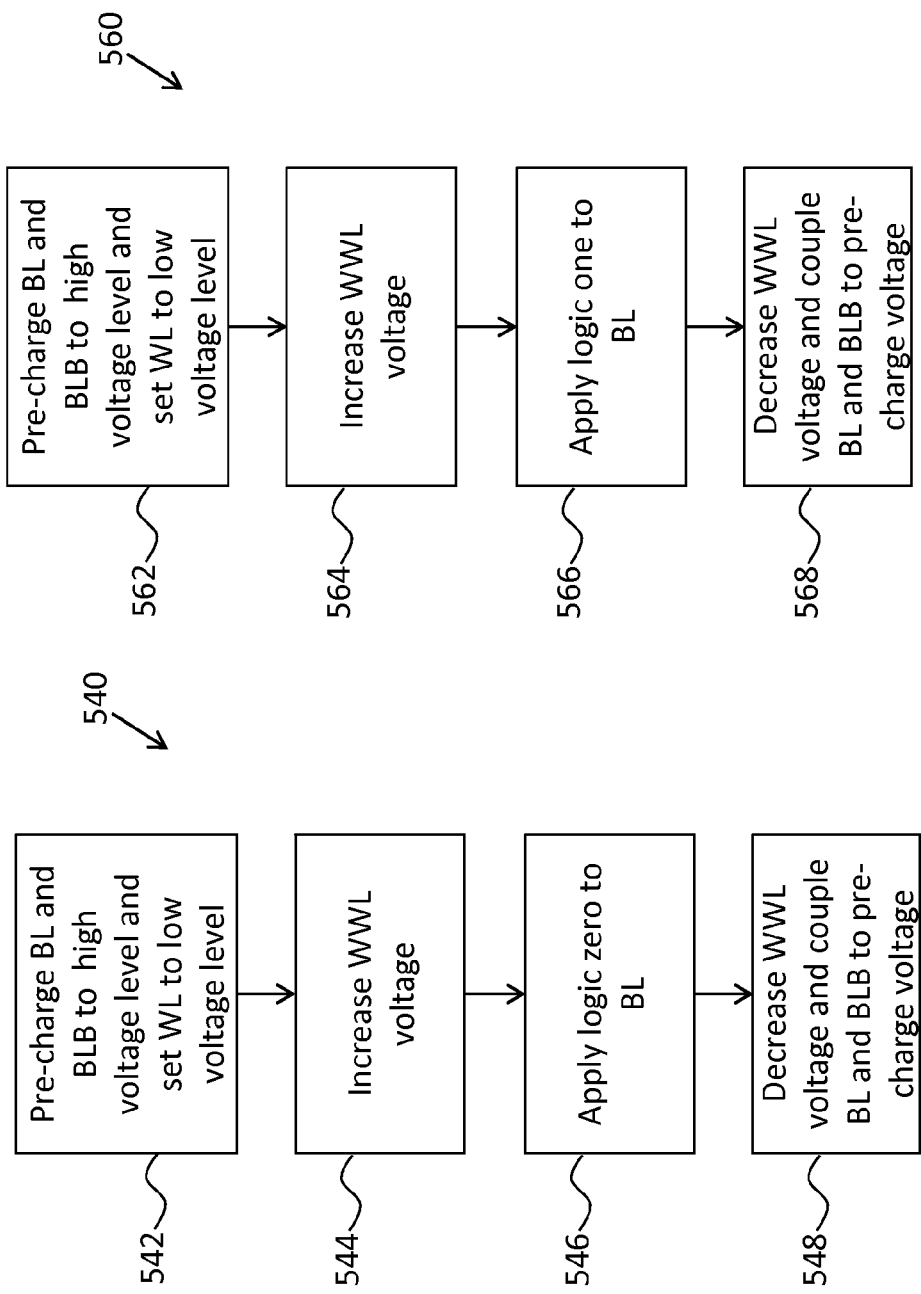
FIG. 5C is a flow diagram of one example of a method of writing a logic zero to a bit cell in accordance with some embodiments.
FIG. 5D is a flow diagram of one example of a method of writing a logic one to a bit cell in accordance with some embodiments.

The writing of a logic zero to node 142, which is equivalent to write a logic one to node 124, is described with reference to FIG. 5C, which is a flow diagram of one example of a method 540 of such operation. At block 542, bit lines BL and BLB are pre-charged to a pre-charge voltage by a pre-charge circuit (not shown) and the WWL is at a low voltage level, i.e., VSS or ground. In some embodiments, the pre-charge voltage is generated by a pre-charge circuit (not shown) and is a high voltage level, e.g., VDD, or another voltage level, e.g., VDD/2. In some embodiments, the BL and BLB are not pre-charged or are pre-charged to other voltage levels. With the WWL set at approximately VSS or ground, pass transistors 128-1 and 128-2 are off due to their gate-source voltages, $V_{GS}$, being less than the turn-on or threshold voltages, $V_T$. The RWL is set to a logic zero, which results in RWL' being at a logic one and transistors 120-2 and 122-1 being turned off.

At block 544, the voltage on WWL is increased, such as to VDD, to turn on pass transistors 128-1 and 128-2. In some embodiments, such as the embodiments including a pre-charge circuit, the bit lines BL and BLB are decoupled from the pre-charge voltage source (not shown).

At block 546, the BL is driven to a logic zero by the write I/O circuitry 114 (FIG. 2B), which is coupled to storage node 142 through pass transistor 128-1. The writing of a logic zero at node 142 results in storage node 124 being pulled to a logic one by inverter 138-1. In some embodiments, BLB is also be pulled high at the same time as BL is pulled low to further assist in writing the logic zero to node 142.

At block 548, the writing operation concludes when the voltage on the WWL is decreased, such as from a logic one to a logic zero, to decouple storage nodes 142 and 124 from the BL and BLB, respectively. The BL and BLB may also be coupled to the pre-charge voltage source such that BL and BLB are pre-charged to VDD or other pre-charge voltage, e.g., VDD/2.

The writing of a logic one to node 138, which is equivalent to write a logic zero to node 136, is described with reference to FIG. 5D, which is a flow diagram of one example of a method 560 of such operation. At block 562, bit lines BL and BLB are pre-charged to a pre-charge voltage and WWL is at a low voltage level, i.e., VSS or ground. In some embodiments, the pre-charge voltage is generated by a pre-charge circuit (not shown) and is a high voltage level, e.g., VDD, or another voltage level, e.g., VDD/2. In some embodiments, the BL and BLB are not pre-charged or are pre-charged to other voltage levels. With the WWL set at low voltage level, pass transistors 128-1 and 128-2 are off due to their gate-source voltages, $V_{GS}$, being less than the turn-on or threshold voltages, $V_T$. The RWL is also at a logic zero such that RWL' is a logic one as RWL' has the opposite logic state of RWL. Transistors 120-2 and 122-1 are turned off with the RWL at a low voltage and RWL' at a high voltage level.

At block 564, the voltage on the WWL is increased, such as to VDD, to turn on pass transistors 128-1 and 128-2. In some embodiments, such as embodiments in which pre-charge circuitry is used, the BL and BLB are decoupled from the pre-charge voltage.

At block 566, the BL is driven to a logic one by the write I/O circuitry 114 (FIG. 2B), which is coupled to storage node 142 through pass transistor 128-1. The writing of a logic one at node 142 results in storage node 124 being pulled down to a logic zero by inverter 138-1. In some embodiments, BLB is driven low at the same time the BL is driven high to further assist in writing a logic one to node 142.

At block 568, the writing operation concludes when the voltage one the WWL is decreased. The decreased in the voltage of the WWL decouples the BL and BLB from bit cell 118 as pass transistors 128-1, 128-2 are turned off. In some embodiments, the BL and BLB are coupled to the pre-charge voltage source such that BL and BLB are pre-charged a pre-charge voltage.

FIG. 6 is a flow diagram of one example of a method 600 manufacturing a three-dimensional semiconductor memory in accordance with some embodiments. At block 602, circuitry is formed in and/or on a first layer. For example, the active devices of the bit cells 118 of a bit cell array 106 are formed in a semiconductor substrate (not shown) using a semiconductor processing technology. In some embodiments, the bit cells 116 are formed using complementary metal oxide semiconductor ("CMOS") semiconductor processing technology. The write decoder 112 and write I/O circuitry 114 are also formed in and/or on the first layer 12-1.

At block 604, circuitry is formed in and/or on the second layer. For example, the active devices of the read port cells 116 of a read port cell array 104 are formed in a semiconductor substrate (not shown) using a semiconductor processing technology. In some embodiments, the read port cells 116 are using CMOS semiconductor processing technology. The read decoder 108 and write I/O circuitry 110 are also formed in and/or on the first layer 12-1.

At block 606, the first and second layers are coupled together. For example, if layers 12-1 and 12-2 are separate semiconductor chips, then layers 12-1 and 12-2 are vertically stacked on top of one another, aligned, and bonded together. In some embodiments, such as embodiments in which layers 12-1 and 12-2 are tiers, the layers are stacked on top of one another to create a 3D stacked CMOS IC. One of ordinary skill in the art will understand that one or more layers can be disposed between layers 12-1 and 12-2 in some embodiments.

At block 608, the circuitry formed in and/or on layer 12-1 is coupled to the circuitry formed in and/or on layer 12-2. For example, conductive lines 102 are formed between layers 12-1 and 12-2 to couple together read port cells 116 and bit cells 118. In some embodiments, conductive lines 102 are TSVs or ILVs. The use of ILVs, for example, reduces the loading on the read port cell 116 due to the length of the ILVs being shorter than TSVs, and thus improves the performance of the semiconductor memory.

The disclosed circuits and methods described herein advantageously eliminate the need for a keeper cell by providing dual-port memory cells. Additionally, the bit cells do not suffer from read disturb issues and enable a single bank structure to be utilized. The implementation of a single bank structure improves the area efficiency. The parasitic RC loading on the back-end metal routing of global bit lines is reduced, which also helps to improve the speed of the semiconductor memory.

In some embodiments, a semiconductor memory includes a read port array disposed on a first layer of a three-dimensional integrated circuit and a bit cell array disposed on a second layer of the three-dimensional integrated circuit. The second layer being vertically positioned above or below the first layer. At least one bit cell of the bit cell array is coupled to at least one read port cell of the read port array by a via extending from the first layer to the second layer.

In some embodiments, a read decoder and first input/output circuitry are disposed on the first layer and coupled to the read port array, and a write decoder and second input/output circuitry are disposed on the second layer and coupled to the bit cell array.

In some embodiments, the read port array includes a plurality of read port cells arranged in rows and columns. Each read port cell is coupled to at least one read word line and to at least one global read bit line.

In some embodiments, each read port cell includes at least one of a tri-state buffer or a transmission gate.

In some embodiments, each read port cell includes a first transistor of a first type having a source coupled to a first voltage supply node and a gate coupled to a bit cell by a via extending from the first layer to the second layer. A second transistor of the first type has a source coupled to a drain of the first transistor of the first type, a drain coupled to a global read bit line, and a gate coupled to a complementary read word line. A first transistor of a second type has a source coupled to a second voltage supply node and a gate coupled to the bit cell by the via. A second transistor of the second type has a source coupled to a drain of the first transistor of the second type, a drain coupled to the global read bit line, and a gate coupled to a complementary read word line.

In some embodiments, each read port cell includes a first transistor of a first type and a first transistor of a second type. The first transistor of the first type has a source coupled to a bit cell by a via extending from the first layer to the second layer, a gate coupled to a complementary read word line, and a drain coupled to a global read bit line. The first transistor of the second type has a source coupled to the bit cell by a via extending from the first layer to the second layer, a gate coupled to a complementary read word line, and a drain coupled to the global read bit line.

In some embodiments, each bit cell of the bit cell array includes first and second pass transistors each coupled to a latch, to a write word line, and to a respective complementary bit line. At least one of the read pass transistors is coupled to a read port cell by a via extending from the first layer to the second layer.

In some embodiments, a semiconductor memory includes a first layer of a three-dimensional integrated circuit and a second layer of an three-dimensional integrated circuit disposed vertically above or below the first layer. The first layer includes read input/output circuitry, a read decoder, and a read port array including a plurality of read port cells arranged in rows and columns. Each row of read port cells is coupled to the read decoder by at least one read word line, and each column of read port cells is coupled to the read input/output circuitry by a global bit line. The second layer includes write input/output circuitry, a write decoder, and a bit cell array including a plurality of read port cells arranged in rows and columns. Each row of bit cells is coupled to the write decoder by a write word line, and each column of bit cells is coupled to the write input/output circuitry by a pair of complementary bit lines. Each bit cell is coupled to a respective read port cell by a via extending from the first layer to the second layer.

In some embodiments, each of the plurality of read port cells includes at least one of a tri-state buffer or a transmission gate.

In some embodiments, each read port cell includes a first transistor of a first type having a source coupled to a first voltage supply node and a gate coupled to a bit cell by a via extending from the first layer to the second layer. A second transistor of the first type has a source coupled to a drain of the first transistor of the first type, a drain coupled to a global read bit line, and a gate coupled to a complementary read word line. A first transistor of a second type has a source coupled to a second voltage supply node and a gate coupled to the bit cell by the via. A second transistor of the second type has a source coupled to a drain of the first transistor of the second type, a drain coupled to the global read bit line, and a gate coupled to a complementary read word line.

In some embodiments, each read port cell includes a first transistor of a first type and a first transistor of a second type. The first transistor of the first type has a source coupled to a bit cell by a via extending from the first layer to the second layer, a gate coupled to a complementary read word line, and a drain coupled to a global read bit line. The first transistor of the second type has a source coupled to the bit cell by a via extending from the first layer to the second layer, a gate coupled to a complementary read word line, and a drain coupled to the global read bit line.

In some embodiments, each bit cell of the bit cell array includes first and second pass transistors each coupled to a latch, to a write word line, and to a respective complementary bit line. At least one of the read pass transistors is coupled to a read port cell by a via extending from the first layer to the second layer.

In some embodiments, each latch includes a first transistor of a first type is coupled to a first transistor of a second type.

In some embodiments, the via is an inter-layer via.

In some embodiments, a method includes forming circuitry on a first layer, the circuitry on the first layer including a read port array comprising a plurality of read port cells, forming circuitry on a second layer, the circuitry on the second layer including a bit cell array comprising a plurality of bit cells, and coupling a read port cell on the first layer to a respective bit cell on the second layer.

In some embodiments, forming circuitry on the first layer includes forming a read decoder and read input/output circuitry on the first layer such that the read decoder and the read input/output circuitry are coupled to the read port array.

In some embodiments, the read decoder is coupled to rows of bit cells by read word lines and the read input/output circuitry is coupled to columns of read bit cells by global read bit lines.

In some embodiments, forming circuitry on the second layer includes forming a write decoder and write input/output circuitry on the second layer such that the write decoder and the write input/output circuitry are coupled to the bit cell array.

In some embodiments, the write decoder is coupled to rows of bit cells by write word lines and the write input/output circuitry is coupled to columns of bit cells by bit lines.

In some embodiments, coupling the read port cell to a respective bit cell includes forming a via from the first layer to the second layer.

Although the circuits and methods have been described in terms of exemplary embodiments, they are not limited thereto. Rather, the appended claims should be construed broadly, to include other variants and embodiments of the circuits and methods, which may be made by those skilled in the art without departing from the scope and range of equivalents of the circuits and methods.

What is claimed is:

1. A semiconductor memory, comprising:
   a read port array disposed on a first layer of a three-dimensional integrated circuit; and
   a bit cell array disposed on a second layer of the three-dimensional integrated circuit,
   wherein the second layer being vertically positioned above or below the first layer, and
   wherein each bit cell of the bit cell array is coupled to a respective read port cell of the read port array by a respective via extending from the first layer to the second layer.

2. The semiconductor memory of claim 1, further comprising
   a read decoder and first input/output circuitry disposed on the first layer and coupled to the read port array; and
   a write decoder and second input/output circuitry disposed on the second layer and coupled to the bit cell array.

3. The semiconductor memory of claim 1, wherein the read port array includes a plurality of read port cells arranged in rows and columns, each read port cell being coupled to at least one read word line and to at least one global read bit line.

4. The semiconductor memory of claim 3, wherein each read port cell includes at least one of a tri-state buffer or a transmission gate.

5. The semiconductor memory of claim 3, wherein each read port cell includes:
   a first transistor of a first type having a source coupled to a first voltage supply node and a gate coupled to a bit cell by a via extending from the first layer to the second layer;
   a second transistor of the first type having a source coupled to a drain of the first transistor of the first type, a drain coupled to a global read bit line, and a gate coupled to a complementary read word line;
   a first transistor of a second type having a source coupled to a second voltage supply node and a gate coupled to the bit cell by the via; and
   a second transistor of the second type having a source coupled to a drain of the first transistor of the second type, a drain coupled to the global read bit line, and a gate coupled to a complementary read word line.

6. The semiconductor memory of claim 3, wherein each read port cell includes
   a first transistor of a first type having a source coupled to a bit cell by a via extending from the first layer to the second layer, a gate coupled to a complementary read word line, and a drain coupled to a global read bit line; and
   a first transistor of a second type having a source coupled to the bit cell by a via extending from the first layer to the second layer, a gate coupled to a complementary read word line, and a drain coupled to the global read bit line.

7. The semiconductor memory of claim 1, wherein each bit cell of the bit cell array includes:
   first and second pass transistors each coupled to a latch, to a write word line, and to a respective complementary bit line, at least one of the read pass transistors being coupled to a read port cell by a via extending from the first layer to the second layer.

8. A semiconductor memory, comprising:
   a first layer of a three-dimensional integrated circuit including
   read input/output circuitry,
   a read decoder, and
   a read port array including a plurality of read port cells arranged in rows and columns, each row of read port cells coupled to the read decoder by at least one read word line, and each column of read port cells coupled to the read input/output circuitry by a global bit line; and
   a second layer of the three-dimensional integrated circuit disposed vertically above or below the first layer, the second layer including
   write input/output circuitry, a write decoder, and a bit cell array including a plurality of read port cells arranged in rows and columns, each row of bit cells coupled to the write decoder by a write word line, and each column of bit cells coupled to the write input/output circuitry by a pair of complementary bit lines, wherein each bit cell is coupled to a respective read port cell by a via extending from the first layer to the second layer.

9. The semiconductor memory of claim 8, wherein each of the plurality of read port cells includes at least one of a tri-state buffer or a transmission gate.

10. The semiconductor memory of claim 8, wherein each read port cell includes:

a first transistor of a first type having a source coupled to a first voltage supply node and a gate coupled to a bit cell by a via extending from the first layer to the second layer;

a second transistor of the first type having a source coupled to a drain of the first transistor of the first type, a drain coupled to a global read bit line, and a gate coupled to a complementary read word line;

a first transistor of a second type having a source coupled to a second voltage supply node and a gate coupled to the bit cell by the via; and a second transistor of the second type having a source coupled to a drain of the first transistor of the second type, a drain coupled to the global read bit line, and a gate coupled to a complementary read word line.

11. The semiconductor memory of claim 8, wherein each read port cell includes a first transistor of a first type having a source coupled to a bit cell by a via extending from the first layer to the second layer, a gate coupled to a complementary read word line, and a drain coupled to a global read bit line; and a first transistor of a second type having a source coupled to the bit cell by a via extending from the first layer to the second layer, a gate coupled to a complementary read word line, and a drain coupled to the global read bit line.

12. The semiconductor memory of claim 8, wherein each bit cell of the bit cell array includes:

first and second pass transistors each coupled to a latch, to a write word line, and to a respective complementary bit line, at least one of the read pass transistors being coupled to a read port cell by a via extending from the first layer to the second layer.

13. The semiconductor memory of claim 12, wherein each latch includes a first transistor of a first type coupled to a first transistor of a second type.

14. The semiconductor memory of claim 8, wherein the via is an inter-tier via extending from the first layer disposed in a first tier to the second layer disposed in a second tier.

15. A method, comprising:

forming circuitry on a first layer, the circuitry on the first layer including a read port array comprising a plurality of read port cells;

forming circuitry on a second layer, the circuitry on the second layer including a bit cell array comprising a plurality of bit cells; and coupling each read port cell on the first layer to a respective bit cell on the second layer by a respective via.

16. The method of claim 15, wherein forming circuitry on the first layer includes forming a read decoder and read input/output circuitry on the first layer such that the read decoder and the read input/output circuitry are coupled to the read port array.

17. The method of claim 16, wherein the read decoder is coupled to rows of bit cells by read word lines and the read input/output circuitry is coupled to columns of read bit cells by global read bit lines.

18. The method of claim 15, wherein forming circuitry on the second layer includes forming a write decoder and write input/output circuitry on the second layer such that the write decoder and the write input/output circuitry are coupled to the bit cell array.

19. The method of claim 18, wherein the write decoder is coupled to rows of bit cells by write word lines and the write input/output circuitry is coupled to columns of bit cells by bit lines.

20. The method of claim 15, wherein coupling the read port cell to a respective bit cell includes forming a via from the first layer to the second layer.

* * * * *